(12) United States Patent
Nallan et al.

(10) Patent No.: US 6,531,404 B1
(45) Date of Patent: Mar. 11, 2003

(54) METHOD OF ETCHING TITANIUM NITRIDE

(75) Inventors: Padmapani Nallan, San Jose, CA (US); Tong Zhang, Palo Alto, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/632,455

(22) Filed: Aug. 4, 2000

(51) Int. Cl.$^7$ ............................................. H01L 21/302
(52) U.S. Cl. ...................... 438/714; 438/720; 438/722
(58) Field of Search ................... 438/710, 712, 438/706, 714, 720, 722, 733

(56) References Cited

U.S. PATENT DOCUMENTS

| | | | |
|---|---|---|---|
| 4,675,073 A | | 6/1987 | Douglas ..................... 156/643 |
| 5,010,032 A | * | 4/1991 | Tang et al. .................... 437/57 |
| 5,186,718 A | | 2/1993 | Tepman et al. ............ 29/25.01 |
| 6,013,582 A | * | 1/2000 | Ionov et al. ................ 438/738 |
| 6,043,163 A | | 3/2000 | Tsai et al. ................... 438/706 |
| 6,146,542 A | * | 11/2000 | Ha et al. ....................... 216/2 |
| 6,218,255 B1 | * | 4/2001 | Fritzinger et al. .......... 438/386 |

OTHER PUBLICATIONS

J.G. Fleming et al., "Modifications of Fillet Structures to Form Tip Emitters", 9$^{th}$ International Vacuum Microelectronics Conference, St. Petersburg 1996, pp. 375–379.

D. B. King and J. G. Fleming, Testing of Fillet Emitter Structures with Well Defined Emitter–to–Gate Spacings, 9$^{th}$ International Vacuum Microelectronics Conference, St. Petersburg 1996, pp. 411–414.

Dong–Gu Lee et al., "Fabrication of volcano–type TiN field emitter arrays", *J. Vac. Sci. Technol.* B 18(2), Mar./Apr. 2000, pp. 1085–1088.

J. T. C. Lee et al., "Plasma etching process development using in situ optical emission and ellipsometry", *J. Vac. Sci. Technol.* B 14(5), Sep./Oct. 1996, pp. 3283–3290.

Thomas E. Tang et al., "Titanium Nitride Local Interconnect Technology for VLSI", *IEEE Transactions on Electron Devices*, vol. ED–34, No. 3, Mar. 1987, pp. 682–688.

Thomas Tang et al., "VLSI Local Interconnect Level Using Titanium Nitride", International Electron Devices meeting, Technical Digest, 1985, Washington, DC, Dec. 1–4, pp. 590–593.

Yan Ye et al., "0.35–Micron and Sub–0.35–Micron Metal Stack Etch In A DPS Chamber—DPS Chamber and Process Characterization", *Electrochemical Society Proceedings*, vol. 96–12, pp. 222–233.

* cited by examiner

*Primary Examiner*—Benjamin L. Utech
*Assistant Examiner*—Kin-Chan Chen
(74) *Attorney, Agent, or Firm*—Shirley L. Church; Kathi Bean; Joseph Bach

(57) ABSTRACT

The present disclosure pertains to a method of plasma etching a titanium nitride layer within a semiconductor structure. In many embodiments of the method, the titanium nitride layer is etched using a source gas comprising chlorine and a fluorocarbon. Also disclosed herein is a two-step method of plasma etching a titanium nitride gate consisting of a main etch step, followed by an overetch step which utilizes a source gas comprising chlorine and a bromine-containing compound, to etch a portion of the titanium nitride layer which was not etched in the main etch step. The chlorine/bromine overetch chemistry can be used in conjunction with a chlorine/fluorocarbon main etch chemistry, or with any other titanium nitride etch chemistry known in the art.

19 Claims, 3 Drawing Sheets

METHOD OF ETCHING TITANIUM NITRIDE

BACKGROUND OF THE INVENTION

1. Field of the Invention

The present invention pertains to a method of etching titanium nitride within a semiconductor structure. The method of the invention is particularly useful in etching patterned structures such as a titanium nitride gate, but may also be used for surface etchback of a titanium nitride layer.

2. Brief Description of the Background Art

The use of metal gates within semiconductor structures is a relatively new concept in the art of semiconductor manufacture. Titanium nitride is one material that is under investigation for use in gates. The use of titanium nitride as a gate material has been described, for example, by Thomas Tang et al. (*International Electronic Devices Meeting Technical Digest,* pp. 590–593, 1985; *IEEE Transactions on Electron Devices,* Vol. ED-34, No. 3, pp. 682–688, 1987); J. G. Fleming et al. (*Proceedings of the 9th International Vacuum Microelectronics Conference,* pp. 375–379, 1996); D. B. King et al. (*Proceedings of the 9th International Vacuum Microelectronics Conference,* pp. 411–414, 1996); J. T. C. Lee et al. (*J. Vac. Sci. Technol.* B, Vol. 14, No. 5, pp. 3283–3290, 1996); and Dong-Gu Lee et al. (*J. Vac. Sci. Technol.* B, Vol. 18, No. 2, pp. 1085–1088, 2000).

Titanium nitride has frequently been used in the past as a barrier layer material in aluminum metallization structures, to prevent the migration of silicon from an underlying substrate into an overlying aluminum metallization layer. Conventional chemistry for etching titanium nitride layers has been chlorine-based. Chlorine provides a very high etch rate for titanium nitride. However, a high etch rate is not always desirable when one is considering etching a very thin (i.e., <1000 Å) titanium nitride layer, particularly when that thin layer is used as a gate within a semiconductor structure.

It would therefore be desirable to provide a method which provides control in the etching of thin layers of titanium nitride, and particularly control in the etching of patterned layers of titanium nitride such as in the etching of a titanium nitride metal gate within a semiconductor structure.

SUMMARY OF THE INVENTION

We have discovered a method of plasma etching titanium nitride which provides an advantageous etch rate while enabling excellent profile control during the etching of patterned structures. This method may be used alone in a single etch step, or may be used as the main etch step in a two step process, where an overetch step follows the main etch step. The two step etch process is typically used when etch selectivity of the titanium nitride to an adjacent (commonly underlying) oxide is important.

The method (or main etch step) of etching titanium nitride employs a plasma source gas comprising chlorine and a fluorocarbon gas to produce the chemical etchant species. Chlorine is the main etchant species, while the fluorocarbon serves as the secondary etchant and also provides sidewall passivation. The fluorocarbon is selected from fluorine-containing compounds having the formula $C_xH_yF_z$, where x ranges from 1 to 4, y ranges from 0 to 3, and z ranges from 1 to 10. By changing the ratio of chlorine to fluorine in the plasma source gas, the etch rate can be controlled. In addition, when the etch is a patterned etch, the etch profile of the etched titanium nitride feature, such as a gate structure, can be accurately controlled. Addition of a fluorocarbon to the source gas also allows control over the amount of sidewall passivation and thus, the sidewall profile, for example, of an etched gate. The presence of the fluorocarbon also reduces the titanium nitride etch rate, permitting greater control over the etch process than when chlorine is used as the sole etchant for titanium nitride.

For example, a titanium nitride metal gate within a semiconductor structure is etched by exposing the titanium nitride to a plasma generated from a source gas comprising chlorine and a fluorocarbon. One plasma source gas which has been demonstrated to work well employs the use of $Cl_2$ and $CF_4$ as the chemical etchant species. Other essentially chemically inert gases may be used in combination with the chemical etchant species. In general, the method employs an atomic ratio of chlorine: fluorine ranging from about 1:10 to about 10:1; preferably, the chlorine: fluorine atomic ratio ranges from about 1:5 to about 5:1. In the instance of a titanium nitride metal gate etch, a chlorine: fluorine atomic ratio ranging from about 1:1 to about 5:1 works particularly well.

When a titanium nitride layer is etched back, without the need for submicron size patterning, it is possible to use $CF_4$ only as the reactive etchant species. Since etched pattern profile control is not a major concern, and the main concern is control toward the end of the etching process, $CF_4$ alone provides an overall slower etch rate, which enables better control toward the end of the etchback step. When the titanium nitride layer is thin (less than about 1,000 Å), the use of $CF_4$ alone as the reactive etchant provides a simplified process. When the titanium nitride is thicker, to an extent that etch time becomes important, it may be necessary to use a chlorine-containing main etch step and then to use solely a $CF_4$ reactive etchant to complete the etchback. In the alternative, after the main etch step, an overetch step using the chemistry described below may be used to reach the underlying surface layer to which the titanium nitride layer is to be etched back.

In addition to the use of the etch chemistry described above, we have discovered that improved selectivity for etching titanium nitride relative to an underlying oxide layer (such as, for example and not by way of limitation, silicon oxide, silicon oxynitride, barium strontium titanate, tantalum oxide, zirconium oxide, zirconium silicate, hafnium oxide, and hafnium silicate, as well as combinations thereof), can be obtained by using a two step etch method. In the two step etch method, the main etch is carried out using a first plasma source gas comprising chlorine and a fluorocarbon, as described above (or an etch chemistry which is conventional within the art of etching titanium nitride), followed by an overetch step in which the plasma source gas comprises chlorine and bromine, which serve as the chemical etchant species. Other essentially chemically inert gases may be used in combination with the gases which provide the chemical etchant species.

In the overetch step, chlorine and bromine species are typically present at concentrations to provide a chlorine: bromine atomic ratio within the range of about 1:4 to about 4:1. This atomic ratio may be adjusted in combination with bias power to the structure which includes the titanium nitride layer to be etched. One overetch step plasma source gas which has been demonstrated to work particularly well employs $Cl_2$ and HBr as the plasma source gases used to generate the chemical etchant species.

When the end of the main etch step is determined by endpoint, using an optical sensing technique, for example, typically, about 98% of the thickness of the titanium nitride feature (such as a gate) is etched during the main etch step, with the remainder being etched during the overetch step. When the main etch step is a timed etch, typically about 80% of the etch is carried out during the main etch step, with the remainder being etched during the overetch step.

By controlling the etch rate in the main etch step, even thin layers (i.e., <1000 Å) of titanium nitride can be etched reliably. By controlling the gate etch profile in the main etch step, more devices can be placed on a given surface area of a semiconductor substrate. By controlling the selectivity of the etch of the titanium nitride gate relative to an underlying oxide layer, the gate can be etched without the danger of etch through of the underlying oxide layer.

DETAILED DESCRIPTION OF THE PREFERRED EMBODIMENTS

Described in detail below is a method of etching a titanium nitride metal gate within a semiconductor structure. In particular, the method comprises exposing a titanium nitride to a plasma generated from a source gas comprising chlorine and a fluorocarbon, where the ratio of chlorine: fluorine in the source gas is preferably about 1:5. Also described below is a two-step method of plasma etching a titanium nitride gate consisting of a main etch step, followed by an overetch step. The two step method employs a main etch step plasma source gas comprising chlorine and a fluorocarbon (or other known source gas useful in the etching of titanium nitride), and an overetch step plasma source gas comprising chlorine and bromine.

As a preface to the detailed description, it should be noted that, as used in this specification and the appended claims, the singular forms "a", "an", and "the" include plural referents, unless the context clearly dictates otherwise.

I. An Apparatus for Practicing the Invention

The embodiment etch processes described herein were carried out in a Centura® Integrated Processing System available from Applied Materials, Inc. of Santa Clara, Calif. The system is shown and described in U.S. Pat. No. 5,186,718, the disclosure of which is hereby incorporated by reference. Although the etch process chamber used in the EXAMPLES presented herein is shown in schematic in FIG. 1, any of the etch processors available in the industry should be able to take advantage of the etch chemistry described herein, with some adjustment to other process parameters. The equipment shown in schematic in FIG. 1 includes a Decoupled Plasma Source (DPS) of the kind described by Yan Ye et al. at the Proceedings of the Eleventh International Symposium of Plasma Processing, May 7, 1996 and as published in the Electrochemical Society Proceedings, Volume 96-12, pp. 222–233 (1996), which is hereby incorporated by reference. The plasma processing chamber enables the processing of an 8 inch (200 mm) diameter wafer.

Figure 1:
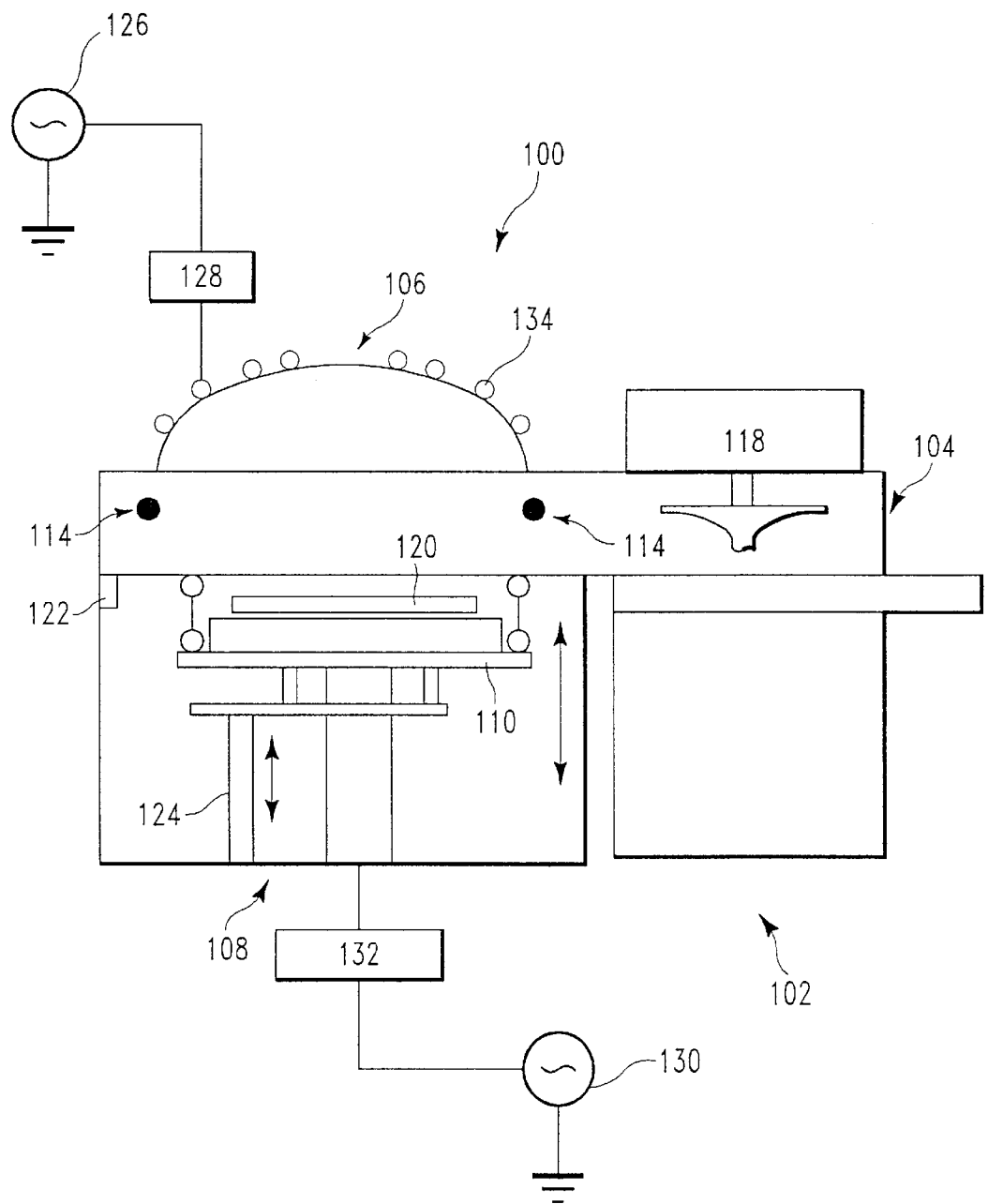
FIG. 1 shows an example of an apparatus which can be used to carry out the etching processes described herein.

FIG. 1 shows a schematic of a side view of an individual CENTURA® DPS™ polysilicon etch chamber 100. The etch chamber 100 consists of an upper chamber 104 having a ceramic dome 106, and a lower chamber 108. The lower chamber 108 includes a monopolar electrostatic chuck (ESC) cathode 110. Gas is introduced into the chamber via gas injection nozzles 114 for uniform gas distribution. Chamber pressure is controlled by a closed-loop pressure control system (not shown) using a throttle valve 118. During processing, a substrate 120 is introduced into the lower chamber 108 through inlet 122. The substrate 120 is held in place by means of a static charge generated on the surface of electrostatic chuck (ESC) cathode 110 by applying a DC voltage to a conductive layer (not shown) located under a dielectric film (not shown) on the chuck surface. The cathode 110 and substrate 120 are then raised by means of a wafer lift 124 and sealed against the upper chamber 104 in position for processing. Etch gases are introduced into the upper chamber 104 via gas injection nozzles 114. The etch chamber 100 uses an inductively coupled plasma source power 126 and matching network 128 operating at 12.56 MHZ for generating and sustaining a high density plasma. The wafer is biased with an RF source 130 and matching network 132 operating at 13.56 MHZ. Plasma source power 126 and substrate biasing means 130 are controlled by separate controllers (not shown).

Although the Examples provided herein were carried out using a CENTURA® DPS™ etch system, a capacitive etch tool such as an eMax™ CENTURA® etch system available from Applied Materials, Inc.

II. Method of Etching a Titanium Nitride Metal Gate

Figure 2A:
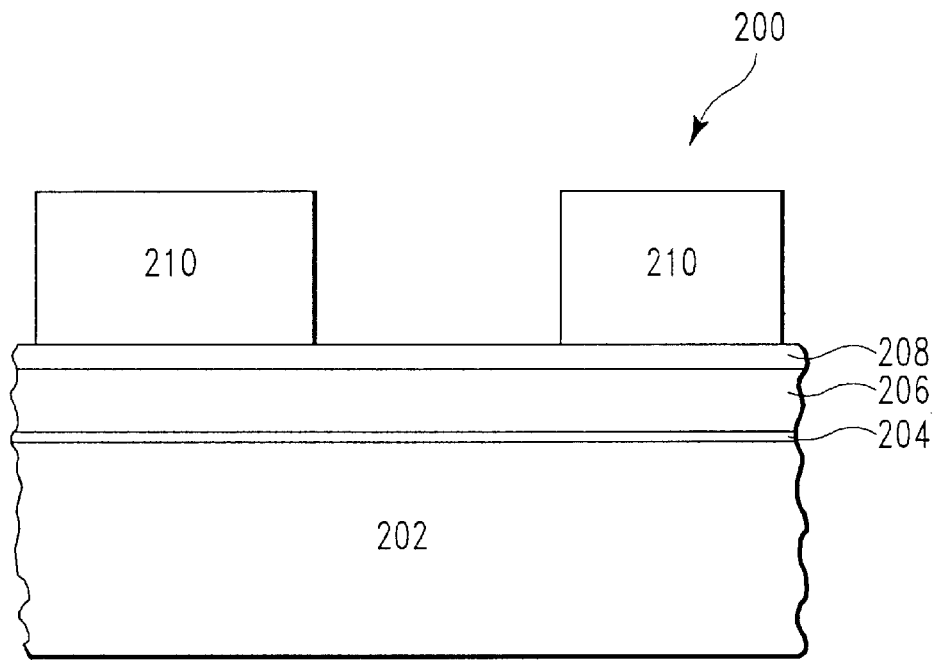
FIG. 2A shows a beginning semiconductor structure 200 for performing the method of the invention. Semiconductor structure 200 includes, from top to bottom, a patterned layer 210 of photoresist, a dielectric ARC (DARC) layer 208, a titanium nitride gate layer 206, and a layer 204 of an oxide, all deposited on a silicon substrate 202. The relative thicknesses of the film stack layers shown are not to scale.

Referring to the figures, FIG. 2A shows a beginning semiconductor structure 200 of the kind which is illustrative of the method of the invention. FIG. 2A is not to scale. The Semiconductor structure 200 includes, from top to bottom, a patterned layer 210 of photoresist, a dielectric ARC (DARC) layer 208, a titanium nitride gate layer 206, and a layer 204 of an oxide (or silicon nitride), all deposited on a substrate 202, which is typically silicon. The term ARC refers to a layer of material that is used as an anti-reflective coating.

The thickness of and patterning method for the photoresist layer 210 will depend on the particular photoresist material used. Photoresist layer 210 may be any suitable photoresist material known in the art. Typically, the photoresist is an organic, carbon-containing material. A frequently used photoresist is a DUV photoresist available from either JSR or Shipley. A typical film thickness for such a DUV photoresist ranges from about 4,000 Å to about 10,000 Å.

The DARC layer 208 typically comprises silicon oxynitride ($SiO_xN_y$) and is typically formed to have a thickness within the range of about 300 Å to about 600 Å. The silicon oxynitride DARC layer 208 is typically deposited using conventional methods known in the art, such as plasma-enhanced chemical vapor deposition (PECVD). The use of an organic-based ARC layer is also contemplated as a part of this disclosure.

The titanium nitride layer 206, from which the gate is to be formed, typically exhibits a thickness within the range of about 200 Å to about 1,500 Å. The titanium nitride gate layer 206 is typically deposited using conventional methods known in the art, such as physical vapor deposition (PVD) or chemical vapor deposition (CVD).

When oxide layer 204 is silicon oxide, for example, the oxide layer thickness commonly ranges from about 15 Å to about 50 Å. When the oxide layer is tantalum pentoxide, for example, the oxide layer thickness commonly ranges from about 30 Å to about 200 Å. Such oxide layers are typically deposited using conventional methods known in the art, such as thermal oxidation or PECVD.

Figure 2B:
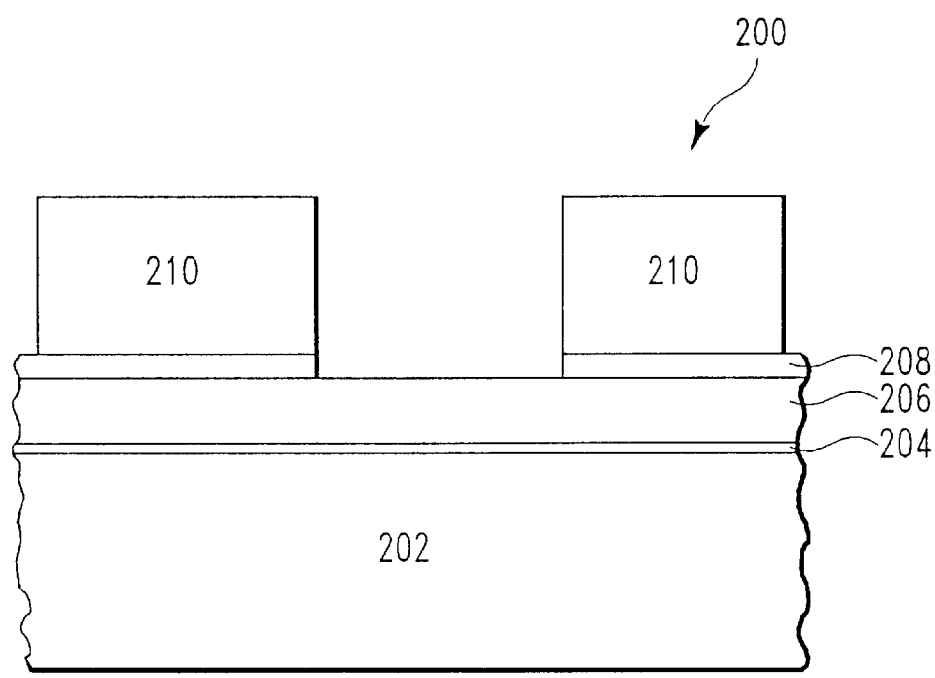
FIG. 2B shows the semiconductor structure 200 after etching of the DARC layer 208.

After patterning of the photoresist layer 210, to achieve the structure shown in FIG. 2A, the DARC layer 208 is etched, as shown in FIG. 2B, to expose a surface of the titanium nitride gate layer 206. Often (as shown in Tables Two and Three), the DARC layer 208 is etched in a single processing step with the titanium nitride gate layer 206, using the same etch chemistry and process conditions. Alternatively, the DARC layer 208 may be etched in a separate step, using conventional etch chemistry and methodology known in the art.

After etching the DARC layer 208, the titanium nitride gate layer 206 is etched, according to the method of the invention, using a plasma generated from a source gas comprising chlorine and a fluorocarbon. The source gas for the main titanium nitride etch step typically employs $Cl_2$ and a fluorine-containing compound to provide the reactive etchant species. The fluorine-containing compound is preferably a fluorocarbon having the formula $C_xH_yF_z$, wherein x ranges from 1 to 4, y ranges from 0 to 3, and z ranges from 1–10. In one preferred embodiment, the source gas for the main titanium nitride etch step is $Cl_2$ and $CF_4$. HCl may be used to provide the reactive chlorine species, depending on adjacent materials in the semiconductor structure. The source gas for the main titanium nitride etch step may include a chemically inert gas such as argon, neon, krypton, or helium, for example, which is present at a concentration up to about 70 volumetric % of the overall gas flow. Nitrogen may be added as a passivant, at volumetric concentrations up to about 70 volumetric % of the overall gas flow. The amount of inert gas or nitrogen added to the plasma source gas is determined by the amount of physical (bombardment) etching contribution which is desired, relative to the chemical, reactive etching.

The atomic ratio of chlorine:fluorine in the main etch plasma source gas typically ranges from about 1:10 to about 10:1, preferably from about 1:5 to about 5:1. In the main etch, chlorine/fluorocarbon chemistry can be used to etch through the entire thickness of the titanium nitride gate layer 206, exposing a surface of the oxide layer 204, as shown in FIG. 2D. However, the underlying oxide layer 204 is a relatively thin layer (typically about 15 Å to about 50 Å thick for silicon oxide, or about 30 Å to about 200 Å thick for tantalum pentoxide, for example, depending on the device), and there is the danger that the selectivity in favor of etching titanium nitride relative to oxide may not be adequate for the chlorine/fluorocarbon chemistry, to prevent etch through of the oxide layer during completion of etching through the titanium nitride gate layer 206. The selectivity for etching titanium nitride relative to silicon oxide for the chlorine/fluorocarbon chemistry typically ranges from about 2:1 to about 5:1. When the oxide layer thickness is about 50 Å or greater, a selectivity of about 2:1 is adequate. When the oxide layer thickness is about 20 Å or less, the titanium nitride gate layer is preferably used using a two step main etch/overetch method.

Figure 2C:
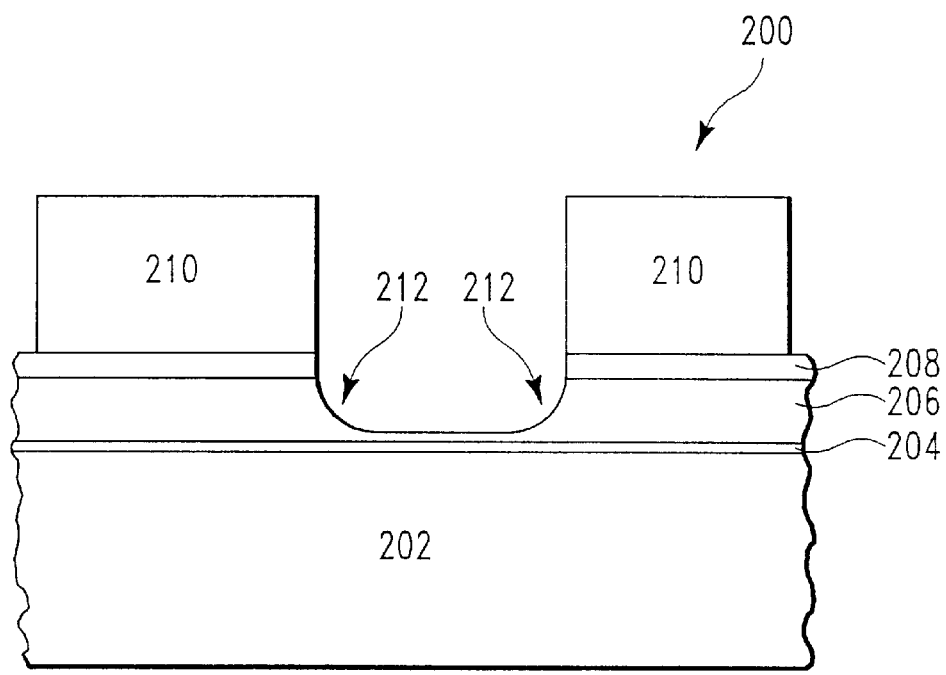
FIG. 2C shows the semiconductor structure 200 after etching at least 80% of the thickness of the titanium nitride gate layer 206. This structure is representative of the two step etch method after a timed main etch step has been performed, and prior to an overetch step.
Figure 2D:
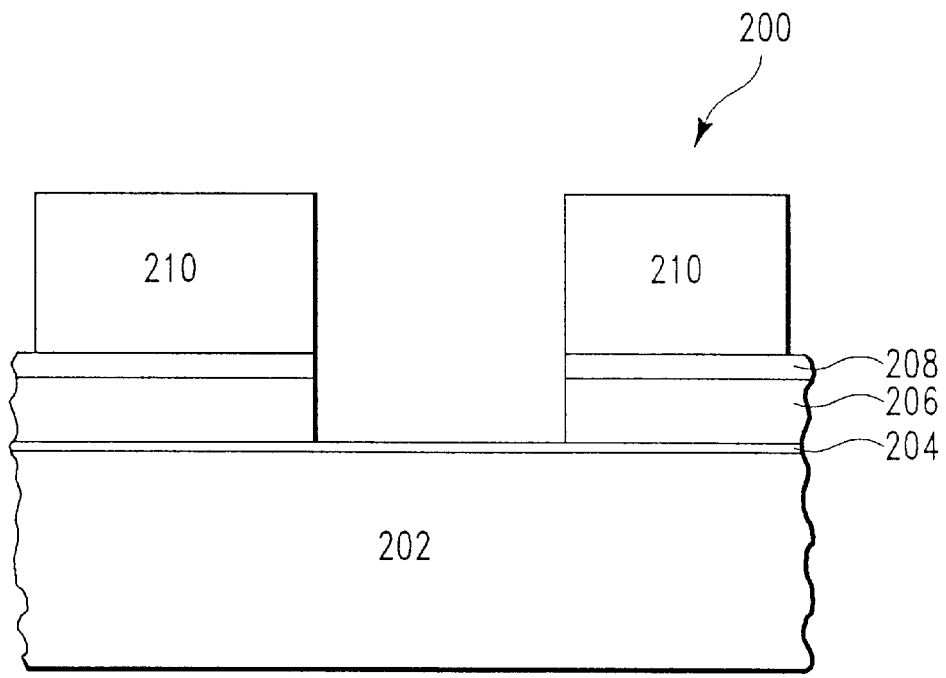
FIG. 2D shows the semiconductor structure 200 after etching through the entire thickness of the titanium nitride gate layer 206.

A two-step embodiment of the method of the invention can be used as illustrated by a combination of FIGS. 2C and 2D. In the two-step embodiment, the main etch step may be a timed etch, which is used to etch about 80% of the thickness of the titanium nitride gate layer 206, as shown in FIG. 2C. In the alternative, when the underlying oxide layer is sufficiently thick, the main etch may be a measured end point etch (such as an interferometric end point), which is used to etch about 98% or greater of the thickness of the titanium nitride gate layer 206. With reference to the timed etch (sometimes referred to as a "soft landing" etch), an overetch step is then performed to etch the remaining 20% of the thickness of the titanium nitride layer, including removal of the "feet" 212, and to expose the underlying silicon oxide layer 204. With reference to the measured end point etch, an overetch step is then performed to remove residual titanium nitride material from patterned areas which may be more protected (where all of the titanium nitride layer has been removed in more exposed areas).

In the overetch step, the remaining titanium nitride is etched using chlorine and bromine reactive species. The plasma source gas employed in the overetch step typically comprises $Cl_2$ and a bromine containing compound such as HBr. The atomic ratio of chlorine: bromine in the overetch step typically ranges from about 1:4 to about 4:1. This generally provides a selectivity for etch of titanium nitride: silicon oxide which ranges from about 50:1 to about 100:1, and an etch rate ranging from about 800 Å/min to about 500 Å/min. The selectivity can be altered by the application of substrate bias power, where the effect is apparatus sensitive. However, one skilled in the art can develop a combination of an atomic ratio of chlorine: bromine with applied substrate bias which will produce the desired result. An emission endpoint detection system is used to detect breakthrough to the underlying oxide layer 204.

Typical process conditions for the main etch and overetch steps according to the method of the invention are presented in Table One, below.

TABLE ONE

Typical Process Conditions for Main Titanium Nitride Gate Etch and Overetch

| Process Parameter | Main Etch | Overetch |
|---|---|---|
| Total Plasma Source Gas Flow Rate (sccm) | 200–400 | 200–400 |
| $Cl_2$ Flow Rate (sccm) | 20–200 | 20–200 |
| $CF_4$ Flow Rate (sccm) | 10–100 | — |
| HBr Flow Rate (sccm) | — | 20–200 |
| Plasma Source Power (W) | 300–3,000 | 300–3,000 |
| Substrate Bias Power (W) | 40–200 | 10–60 |
| Process Chamber Pressure (mTorr) | 4–10 | 10–50 |
| Substrate Temperature (° C.) | 10–100 | 10–100 |

The term Bias Power refers to the power applied to the substrate (typically to the substrate support pedestal) to produce a negative voltage on the substrate surface. Generally, the negative voltage is used to control bombardment of the substrate surface by high energy species.
The term Source Power refers to the power that is applied to generate and sustain the plasma.

The overetch chemistry described above can be used in conjunction with the main etch chemistry of the invention, as shown in Table 1, or may be used with a different titanium nitride etch chemistry known in the art.

Tables Two and Three provide exemplary data generated during development of the main etch and overetch steps of the method of the invention. Tables Two and Three provide process conditions for the DARC etch, TiN main etch (ME), and TiN overetch (OE) steps. Process conditions presented include the following: process gas flow rates (in sccm), process chamber pressure (in mTorr), plasma source power (Ws), substrate bias power (Wb), substrate temperature during etching (°C.), and endpoint time (in seconds). All endpoints are timed endpoints unless designated "EP", in which case they were determined using an interferometric endpoint detection system.

The experimental runs described in Tables Two and Three for Run #s 1–6 were performed using the following film stack (layers listed from top to bottom): a 5500 Å Shipley DUV photoresist layer (previously patterned); a 300 Å $SiO_xN_y$ DARC layer; an 800 Å TiN layer; and a 500 Å $Ta_2O_5$ layer, all deposited on a silicon substrate. The experimental Run #s 7 and 8 in Table 3 was performed using the same film stack with the exception of the oxide layer, which was a 45 Å thick layer of $SiO_2$.

The term "etch profile" (or "feature profile") as used below generally refers to, but is not limited to, a cross-sectional view of a gate structure, as shown in FIGS. 2A through 2D, and is described in terms of an angle between the etched sidewall of a gate layer and the surface on which the gate structure stands (i. e., the underlying layer of tantalum pentoxide). The term "vertical profile" refers to a cross-sectional view of the etched gate layer, where the sidewalls of the etched gate layer are perpendicular to the silicon oxide surface. The term "undercut" profile refers to a cross-sectional view of the etched gate layer, where the width of the etched opening is larger as the distance away from the opening on the substrate surface increases. The term "tapered" profile refers to a cross-sectional view of the etched gate layer, where the width of the etched opening is smaller as the distance away from the opening on the substrate surface increases. The term "critical dimension" typically refers to the smallest dimension of the feature which must be controlled to produce the desired structure.

TABLE TWO

Titanium Nitride Main Etch and Overetch Developmental Data

| Run # | DARC Etch | TiN Main Etch | TiN Overetch | Comments |
|---|---|---|---|---|
| 1 ($Ta_2O_5$ Oxide) | 40 sccm $CF_4$<br>40 sccm $Cl_2$<br>120 sccm Ar<br>4 mTorr<br>500 Ws<br>120 Wb<br>50° C.<br>16.4 sec (EP) | 30 sccm $CF_4$<br>15 sccm $Cl_2$<br>4 mTorr<br>250 $W_s$<br>60 $W_b$<br>50° C.<br>20 sec (EP) | 100 sccm Cl2<br>100 sccm HBr<br>10 mTorr<br>800 $W_s$<br>10 $W_b$<br>50° C.<br>20 sec | Tapered profile after main etch, but undercut profile after overetch, so overetch species attacking profile. |
| 2 ($Ta_2O_5$ Oxide) | 40 sccm $CF_4$<br>40 sccm $Cl_2$<br>120 sccm Ar<br>4 m Torr<br>500 $W_s$<br>120 Wb<br>50° C.<br>17 sec (EP) | 15 sccm $CF_4$<br>30 sccm $Cl_2$<br>4 m Torr<br>300 $W_s$<br>60 $W_b$<br>50° C.<br>13.9 sec (EP) | 100 sccm $Cl_2$<br>100 sccm $O_2$<br>10 m Torr<br>500 $W_s$<br>60 Wb<br>50° C.<br>30 sec | Tapered profile after main etch and overetch, so overetch does not attack profile. |
| 3 ($Ta_2O_5$ Oxide) | 40 sccm $CF_4$<br>40 sccm $Cl_2$<br>120 sccm Ar<br>4 m Torr<br>500 Ws<br>120 Wb<br>50° C.<br>16.4 sec (EP) | 30 sccm $CF_4$<br>15 sccm $Cl_2$<br>4 m Torr<br>250 $W_s$<br>60 $W_b$<br>50° C.<br>20 sec (EP) | 100 sccm $Cl_2$<br>100 sccm HBr<br>10 m Torr<br>800 $W_s$<br>10 $W_b$<br>50° C.<br>20 sec | Tapered profile after main etch, but undercut profile after overetch, so overetch species attacking profile. |
| 4 ($Ta_2O_5$ Oxide) | 40 sccm $CF_4$<br>40 sccm $Cl_2$<br>120 sccm Ar<br>4 mTorr<br>500 Ws<br>120 Wb<br>50° C.<br>16.8 sec (EP) | 10 sccm $CF_4$<br>35 sccm $Cl_2$<br>4 m Torr<br>350 $W_s$<br>60 $W_b$<br>50° C.<br>12.2 sec (EP) | 100 sccm $Cl_2$<br>100 sccm HBr<br>10 m Torr<br>500 Ws<br>60 $W_b$<br>50° C.<br>30 sec | Increase $Cl_2$ to $CF_4$ ratio and increase $W_s$ in main etch from Run #3; profile more vertical than Run #3 but not enough. Some $Ta_2O_5$ loss. |

TABLE THREE

Titanium Nitride Main Etch and Overetch Developmental Data

| Run # | DARC Etch | TiN Main Etch | TiN Overtech | Comments |
|---|---|---|---|---|
| 5 ($Ta_2O_5$ Oxide) | 40 sccm $CF_4$<br>40 sccm $Cl_2$<br>120 sccm Ar<br>4 m Torr<br>500 Ws<br>120 Wb<br>50° C. | 10 sccm $CF_4$<br>45 sccm $Cl_2$<br>4 m Torr<br>450 $W_s$<br>60 $W_b$<br>50° C.<br>10.5 sec (EP | 100 sccm $Cl_2$<br>100 sccm HBr<br>10 m Torr<br>500 Ws<br>40 Wb<br>50° C.<br>30 sec | Increase in $Cl_2$ to $CF_4$ ratio and increase $W_s$ in main etch from Run #4; profile vertical, but still |

TABLE THREE-continued

Titanium Nitride Main Etch and Overetch Developmental Data

| Run # | DARC Etch | TiN Main Etch | TiN Overtech | Comments |
|---|---|---|---|---|
| | 16.8 sec (EP) | | | some Ta$_2$O$_5$ loss. |
| 6 (Ta2O5 Oxide) | 40 sccm CF$_4$ 40 sccm Cl$_2$ 120 sccm Ar 4 m Torr 500 Ws 120 Wb 50° C. 17 sec (BP) | 10 sccm CF$_4$ 45 sccm Cl$_2$ 4 m Torr 450 W$_s$ 60 W$_b$ 50° C. 10.4 sec (EP | 100 sccm Cl$_2$ 100 sccm HBr 10 m Torr 500 Ws 40 Wb 50° C. 20 sec | Reduced time in overetch to reduce Ta$_2$O$_5$ loss. Vertical profile with no visible Ta$_2$O$_5$ loss. Final Process. |
| 7 (SiO$_2$ Oxide) | 40 sccm CF$_4$ 40 sccm Cl$_2$ 120 sccm Ar 4 m Torr 500 Ws 120 Wb 50° C. 15.3 sec (EP) | 20 sccm CF$_4$ 60 sccm Cl$_2$ 4 m Torr 300 W$_s$ 60 W$_b$ 50° C. 19.6 sec (EP | No overetch step | Punchthrough of the SiO$_2$ layer. Slightly undercut profile |
| 8 (SiO$_2$ Oxide) | 80 sccm CF$_4$ 120 sccm Ar 4 m Torr 500 Ws 120 Wb 20° C. 100 sec (EP) | DARC etch and TiN main etch performed as a single process. | 100 sccm Cl$_2$ 100 sccm HBr 10 m Torr 800 Ws 10 Wb 50° C. 30 seconds | TiN main etch endpointed correctly, very low etch rate, very tapered TiN profile. |

As discussed in the "Summary of the Invention", by changing the ratio of chlorine to fluorine in the plasma source gas, the etch rate and etch profile of the titanium nitride gate can be accurately controlled. Table Four, below, provides TiN etch rate and etch profile data obtained using various chlorine: fluorine atomic ratios in the plasma source gas, with all other process conditions held constant at about 55 sccm of total gas flow, 4 mTorr process chamber pressure, 450 Ws, 60 Wb, and a substrate temperature of 50° C.

TABLE FOUR

Effect of Varying the Chlorine:Fluorine Atomic Ratio on TiN Etch Rate and Etch Profile

| Cl:F Atomic Ratio | Etch Rate | Etch Profile |
|---|---|---|
| 30:15 | 3,450 Å/min | slightly tapered (~87°) |
| 35:10 | 3,930 Å/min | more vertical (~88°) |
| 45:10 | 4,570 Å/min | vertical profile |

The atomic ratio of chlorine to fluorine used in a particular titanium nitride gate etch process will depend upon a number of factors, in particular, the thickness of the titanium nitride gate being etched. For example, when etching a very thin TiN gate (i.e., <500 Å), a lower chlorine: fluorine ratio in the plasma source gas is desired in order to provide a slower, more controllable titanium nitride etch rate. One skilled in the art of semiconductor manufacture will be able to determine the particular chlorine: fluorine atomic ratio that is optimal for etching a particular titanium nitride gate thickness by routine experimentation, after reading the present disclosure.

As shown in Table Four, by adjusting the atomic ratio of chlorine: fluorine in the main etch step of the present invention, it is possible to provide excellent control over both the titanium nitride etch rate and gate etch profile.

With respect to the overetch step, with a 1:1 atomic ratio of Cl$_2$:Br and a 10 W$_b$, the selectivity in favor of etching titanium nitride relative to tantalum pentoxide is about 100:1; however, the etched profile of the titanium nitride was tapered after the main etch, but undercut after the overetch, indicating that the bias power (W$_b$) was too low. When the bias power was increased to 60 W$_b$, this was too much bias power, and some oxide loss was observed (the selectivity had been reduced to less than about 10:1). The bias power was adjusted to 40 W$_b$, which provided a vertical titanium nitride etched profile with no apparent loss of tantalum pentoxide. The overetch step is typically carried out until about 25% of the underling oxide layer thickness is removed. A removal of 10% of the underlying oxide layer thickness would be adequate, and the 25% value is used to ensure that any "feet" remaining from the titanium nitride main etch step are removed. In general, when it is desired to increase the chemical etchant effect, the W$_b$ is lowered and the etching becomes more isotropic. While the selectivity is higher relative to the underlying oxide with a lower W$_b$, care must be taken to avoid undercutting of a vertical etched profile of titanium nitride. When it is desired to increase the physical bombardment etching contribution and to provide more anisotropic etching, the W$_b$ is increased. While the vertical profile tends to be maintained during overetch at higher W$_b$, the selectivity in favor of etching titanium nitride is reduced and the underlying oxide is etched more rapidly. One skilled in the art can, with minimal experimentation, adjust the bias power level to accommodate a given underlying layer, such as, for example, silicon oxide, silicon oxynitride, barium strontium titanate, tantalum oxide, zirconium oxide, zirconium silicate, hafnium oxide, hafnium silicate, silicon nitride, or a combination thereof, which may be underlying the titanium nitride layer.

By combining an atomic ratio of chlorine: fluorine which is advantageous in the main etch step with an atomic ratio of chlorine: bromine and substrate bias power which are advantageous in the overetch step, it is possible to achieve optimal results in any given process apparatus.

The above described preferred embodiments are not intended to limit the scope of the present invention, as one skilled in the art can, in view of the present disclosure, expand such embodiments to correspond with the subject matter of the invention claimed below.

We claim:

1. A method of etching a patterned titanium nitride layer which directly overlies an oxide-comprising layer within a semiconductor structure, comprising exposing said layer of titanium nitride to a plasma generated from a source gas comprising chlorine and a fluorocarbon, wherein the atomic ratio of chlorine: fluorine in said source gas ranges from about 1:10 to about 10:1, wherein said semiconductor structure includes a dielectric ARC layer overlying said titanium nitride layer, and wherein said dielectric ARC layer is etched in the same processing step as said titanium nitride layer.

2. The method of claim 1, wherein said fluorocarbon has the chemical formula $C_xH_yF_z$, where x ranges from 1 to 4, y ranges from 0 to 3, and z ranges from 1 to 10.

3. The method of claim 2, wherein said fluorocarbon is $CF_4$.

4. The method of claim 1 or claim 2, or claim 3, wherein said titanium nitride layer has a thickness of less than about 1000 Å.

5. The method of claim 4, wherein a thickness of an oxide or nitride layer underlying said titanium nitride layer is less than about 500 Å.

6. The method of claim 5, wherein said thickness of said oxide or nitride layer is less than about 50 Å, and the atomic ratio of chlorine:fluorine in said source gas ranges from about 2:1 to about 5:1.

7. The method of claim 6, wherein said thickness of said oxide or nitride layer is less than about 20 Å, and the atomic ratio of chlorine:fluorine in said source gas is at least about 5:1.

8. The method of claim 1, or claim 2, or claim 3, wherein said pattern includes a gate structure.

9. A method of pattern etching a dielectric ARC layer and an underlying titanium nitride layer within a semiconductor structure, comprising the following steps:

a) a main etch step wherein said dielectric ARC layer and said titanium nitride layer are sequentially exposed to a plasma generated from a source gas comprising chlorine and a fluorocarbon, wherein an atomic ratio of chlorine:fluorine in said main etch source gas ranges from about 1:10 to about 10:1, and wherein said main etch step etches through less than about 98% of said layer of titanium nitride; and b) an overetch step following said main etch step, wherein a portion of said layer of titanium nitride which was not etched during said main etch step is exposed to a plasma generated from a source gas comprising chlorine and a bromine-containing compound.

10. The method of claim 9, wherein said etch in step a) is through less than about 80% of said layer of titanium nitride.

11. The method of claim 10, wherein said overetch source gas comprises $Cl_2$ and HBr.

12. The method of claim 9, wherein said overetch source gas comprises $Cl_2$ and HBr.

13. The method of claim 11 or claim 12, wherein an atomic ratio of chlorine:bromine in said second source gas ranges from about 1:4 to about 4:1.

14. The method of claim 13, wherein said chlorine:bromine ratio and a bias power applied to said semiconductor structure during said overetch step are adjusted to provide selectivity relative to an underlying oxide or nitride layer and to achieve a desired titanium nitride etch profile.

15. The method of claim 9 or claim 10, wherein said pattern includes a gate structure.

16. A method of pattern etching a dielectric ARC layer and an underlying titanium nitride layer within a semiconductor structure, comprising the following steps:

a) a main etch step whereinsaid dielectric ARC layer and said titanium nitride layer are sequentially exposed to a plasma generated from a source gas comprising chlorine and a fluorocarbon, wherein an atomic ratio of chlorine:fluorine in said main etch source gas ranges from about 1:10 to about 10:1, and wherein said main etch step etches through about 98% or more of the thickness of said layer of titanium nitride; and b) an overetch step following said main etch step, wherein a remaining portion of the thickness of said layer of titanium nitride which was not etched during said main etch step is exposed to a plasma generated from a source gas comprising chlorine and a bromine-containing compound.

17. The method of claim 16, wherein said overetch source gas comprises $Cl_2$ and HBr.

18. The method of claim 16 or claim 17, wherein an atomic ratio of chlorine:bromine in said second source gas ranges from about 1:4 to about 4:1.

19. The method of claim 18, wherein a combination of said atomic ratio of chlorine:bromine and a bias power applied to said semiconductor structure are adjusted during said overetch step to provide selectivity relative to an underlying oxide or nitride layer and to achieve a desired titanium nitride etch profile.

* * * * *